(12) United States Patent
Yokoyama

(10) Patent No.: US 6,225,179 B1
(45) Date of Patent: May 1, 2001

(54) SEMICONDUCTOR INTEGRATED BI-MOS CIRCUIT HAVING ISOLATING REGIONS DIFFERENT IN THICKNESS BETWEEN BIPOLAR AREA AND MOS AREA AND PROCESS OF FABRICATION THEREOF

(75) Inventor: Hiroaki Yokoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/260,070

(22) Filed: Mar. 2, 1999

(30) Foreign Application Priority Data

Mar. 2, 1998 (JP) .................................................. 10-049290

(51) Int. Cl.[7] .................................................. H01L 21/331
(52) U.S. Cl. ........................ 438/309; 438/318; 438/324; 438/365; 438/369; 438/371; 438/509
(58) Field of Search ..................................... 438/309, 364, 438/368, 370, 508, 509, 318, 324, 365, 369, 202, 371

(56) References Cited

FOREIGN PATENT DOCUMENTS

| 61-251163 | 11/1986 | (JP) . |
| 1-134963 | 5/1989 | (JP) . |
| 5-235285 | 9/1993 | (JP) . |
| 6-77419 | 3/1994 | (JP) . |
| 6-232351 | 8/1994 | (JP) . |
| 8-88360 | 4/1996 | (JP) . |
| 9-92720 | 4/1997 | (JP) . |
| 9-232456 | 9/1997 | (JP) . |

OTHER PUBLICATIONS

Japanese Office Action dated May 30, 2000 with partial English translation.

*Primary Examiner*—Matthew Smith
*Assistant Examiner*—Tgwe U. Anya
(74) *Attorney, Agent, or Firm*—McGinn & Gibb, PLLC

(57) ABSTRACT

A bi-MOS circuit is fabricated on first active regions assigned to the bipolar transistor and on second active regions assigned to the field effect transistors, and the field effect transistors are fabricated after said bipolar transistor, because a high-temperature heat treatment for an emitter diffusion destroys the impurity profiles of the source/drain regions of the field effect transistors, wherein a part of the field oxide layer between the second active regions is covered with an etching stopper layer before deposition of a thick silicon oxide layer in order to widely space the emitter region from the emitter electrode, even though the thick silicon oxide layer is removed from the field oxide layer between the second active regions for fabricating the field effect transistors, the etching stopper layer prevents the field oxide layer from the etchant, and the field oxide layer between the second active regions maintains the original thickness, thereby never allowing a parasitic MOS transistor to turn on.

14 Claims, 7 Drawing Sheets

SEMICONDUCTOR INTEGRATED BI-MOS CIRCUIT HAVING ISOLATING REGIONS DIFFERENT IN THICKNESS BETWEEN BIPOLAR AREA AND MOS AREA AND PROCESS OF FABRICATION THEREOF

FIELD OF THE INVENTION

This invention relates to a semiconductor integrated circuit device and, more particularly, to a semiconductor integrated bi-MOS circuit and a process for fabricating the semiconductor integrated bi-MOS circuit device on a single semiconductor substrate.

DESCRIPTION OF THE RELATED ART

A static random access memory device is a typical example of the semiconductor integrated circuit device. Various circuit configurations for the static random access memory device are known. A high-speed static random access memory device is, by way of example, implemented by a combination of bipolar transistors and field effect transistors. The high-speed static random access memory cell has a field effect transistor, the polysilicon gate electrode of which is of the order of 0.3 micron in width. Such a short channel length affects the high-frequency characteristics of the associated bipolar transistor.

The manufacturer takes two approaches in order to improve the high-frequency characteristics of the bipolar transistor. First, the manufacturer increases the thickness of the oxide layer under the emitter electrode, and the thick oxide layer reduces the parasitic capacitance. Second, the manufacturer decreases the gate oxide layer of the field effect transistor, and the thin gate oxide layer improves the switching action of the field effect transistor.

The bipolar transistor and the field effect transistor are fabricated through the following sequence. First, the thin gate oxide layer of the order of 8 nanometers thick is grown on a semiconductor substrate, and the narrow polysilicon gate electrode is patterned on the thin gate oxide layer. Dopant impurity is ion implanted into the semiconductor substrate, and forms source/drain regions in a self-aligned manner with the narrow polysilicon gate electrode. Subsequently, the thick oxide layer of 100–200 nanometers thick is formed, and the bipolar transistor is fabricated. Namely, a base region is formed, and en emitter region is formed in the base region through diffusion from an emitter electrode passing through an emitter contact hole formed in the thick oxide layer.

However, the manufacturer encounters a problem in the prior art process sequence in the punch-through phenomenon. This is because of the fact that the manufacturer applies heat to the resultant semiconductor structure for forming the emitter region after the completion of the source/drain regions. The dopant impurity is diffused from the source/drain regions into the channel of the order of 0.3 micron in length, and the punch-through phenomenon is liable to take place. If the diffusion is carried out at low temperature for short time, the dopant concentration in the emitter region is too low to achieve large current amplification factor. Thus, there is a trade-off between the punch-through phenomenon and the low current amplification factor.

In order to prevent the field effect transistor from the punch-through phenomenon without reduction of the current amplification factor, the manufacturer uses another prior art process. The bipolar transistor is firstly fabricated on a semiconductor substrate, and, thereafter, fabrication of the field effect transistor follows. Even tough the emitter region is formed through a high-temperature long-time diffusion, the high-temperature long-time diffusion does not affect the impurity profile of the source/drain regions. The source/drain regions are, thereafter, formed through a low-temperature short-time heat treatment.

FIGS. 1A to 1D illustrate the prior art process for fabricating a bi-CMOS circuit. Description is focused on a bipolar transistor and an n-channel enhancement type field effect transistor, and description on a p-channel enhancement type field effect transistor is omitted hereinbelow for the sake of simplicity.

The process starts with preparation of a silicon substrate 1. First, phosphorous is ion implanted into a surface portion of the silicon substrate 1 at dosage of 5E11 to 1E1012 atom/square-cm under acceleration energy of 70–100 KeV, and forms a lightly-doped n-type collector region 3.

Subsequently, silicon oxide is selectively grown to 400 nanometers thick on the major surface by using the LOCOS (Local Oxidation of Silicon) technique, and forms a thick field oxide layer 4. The thick field oxide layer 4 defines an active area assigned to a bipolar transistor and another active area assigned to a field effect transistor.

A photo-resist ion-implantation mask (not shown) is formed on the major surface by using photo-lithographic techniques, and has an opening over a region assigned to a heavily-doped n-type collector contact region 5, and phosphorous is ion implanted into the region at dosage of 5E15 to 1E16 atom/square-cm under acceleration energy of 70–100 KeV. The photo-resist ion-implanted mask is stripped off. The ion-implanted phosphorous is activated at 950–1000 degrees in centigrade for 30–45 minutes. As a result, the heavily-doped n-type collector contact region 5 is formed in the lightly-doped n-type collector region 3.

A photo-resist ion-implantation mask (not shown) is formed on the major surface by using the photo-lithographic techniques, and has an opening over the active area assigned to the bipolar transistor. Phosphorous is ion implanted into the active area at dosage of 3E13 to 5E13 atom/square-cm under acceleration energy of 1000–1200 KeV, and the photo-resist ion-implantation mask is stripped off after the ion-implantation. The phosphorous are activated at 950–1000 degrees in centigrade for 10–20 minutes, and forms an n-type buried layer 6. The n-type buried layer 6 is connected to the heavily-doped n-type collector contact region 5.

Subsequently, an ion-implantation mask (not shown) is formed on the major surface by using the photo-lithographic techniques, and has an opening over the active areas assigned to the field effect transistors. Boron is ion implanted into the active areas at dosage of 1E13 to 2E13 atom/square-cm under acceleration energy 250–300 KeV, and a channel doping is carried out for n-channel enhancement type field effect transistors. The photo-resist ion-implantation mask is stripped off. The boron forms a p-type well 7.

Subsequently, an ion-implantation mask (not shown) is formed on the major surface by using the photo-lithographic techniques, and has an opening over the lightly-doped n-type collector region 3. Boron is ion implanted into the lightly-doped n-type collector region 3 at dosage of 2E13 to 3E13 atom/square-cm under acceleration energy of 15–20 KeV. The ion-implantation mask is stripped off. The boron forms a lightly-doped p-type intrinsic base region 8.

A photo-resist ion-implantation mask (not shown) is formed on the major surface by using the photo-lithographic techniques, and has an opening over a part of the lightly-doped p-type intrinsic base region 8. Boron fluoride is ion implanted into the part of the lightly-doped p-type intrinsic base region 8 at dosage of 1E15 to 2E15 atom/square-cm under acceleration energy of 30–50 KeV. The photo-resist ion-implantation mask is stripped off, and boron fluoride forms a heavily-doped p-type graft base region 9. The resultant semiconductor structure is shown in FIG. 1A.

Silicon oxide is deposited to 100 nanometers thick over the entire surface of the resultant semiconductor structure by using a chemical vapor deposition, and forms a thick silicon oxide layer 10. Not only the active area assigned to the bipolar transistor but also the active areas assigned to the field effect transistors are covered with the thick silicon oxide layer 10.

A photo-resist etching mask (not shown) is formed on the thick silicon oxide layer 10, and has an opening over a part of the lightly-doped p-type intrinsic base region 8. The thick silicon oxide layer 10 is selectively etched away, and an emitter contact hole 11 is formed in the thick silicon oxide layer 10.

Subsequently, polysilicon is deposited to 150 nanometers thick over the entire surface of the resultant semiconductor structure by using a chemical vapor deposition. The polysilicon fills the emitter contact hole 11, and is spread over the thick silicon oxide layer 10. Arsenic is ion implanted into the polysilicon layer at dosage of 1E16 to 1.5 E16 atom/square-cm under acceleration energy of 60–70 KeV. Then, the polysilicon layer is heavily doped with the arsenic.

The arsenic-doped polysilicon layer is heated to 850–900 degrees in centigrade for 15 minutes to 25 minutes. The arsenic is diffused from the polysilicon layer into the lightly-doped p-type intrinsic base region 8, and forms a heavily-doped n-type emitter region 12. The heavily-doped n-type emitter region 12 is nested in the lightly-doped p-type intrinsic base region 8.

A photo-resist etching mask (not shown) is patterned on the polysilicon layer by using the photo-lithographic techniques, and the polysilicon is selectively etched away. As a result, an emitter electrode 13 is formed as shown in FIG. 1B. The emitter electrode 13 passes through the emitter contact hole 11, and is held in contact with the heavily-doped n-type emitter region 12. However, the thick silicon oxide layer 10 is provided under the emitter electrode 13, and reduces the capacitance of a parasitic capacitor coupled to the emitter electrode 13.

Subsequently, n-channel enhancement type field effect transistors are formed as follows. A photo-resist mask 21 is formed on the thick silicon oxide layer 10 and the emitter electrode 13, and the active areas assigned to the field effect transistors are exposed to an opening 22 of the photo-resist mask 21 as shown in FIG. 1C.

Using the photo-resist mask 21 as an etching mask, the thick silicon oxide layer 10 is selectively etched away by using a wet etching technique, and the active areas assigned to the field effect transistors are exposed, again.

The active areas are thermally oxidized, and silicon oxide is grown. The silicon oxide forms gate oxide layers 23 of 7 nanometers thick on the active areas, and the emitter electrode 13 is covered with a silicon oxide layer 14.

Polysilicon is deposited to 100 nanometers thick over the entire surface of the resultant semiconductor structure by using a chemical vapor deposition, and forms a polysilicon layer. Phosphorous is thermally diffused into the polysilicon layer, and is converted to a doped polysilicon. Titanium silicide or tungsten silicide is deposited to 100 nanometers thick over the doped polysilicon layer by using a sputtering technique, and a photo-resist etching mask (not shown) is formed on the refractory metal silicide layer. The refractory metal suicide layer and the doped polysilicon layer are selectively etched away, and a polyside gate electrode 24 is formed. The polyside gate electrode 24 extends over the field oxide layer 4, and reaches the gate oxide layers 23 as shown in FIG. 1D. Finally, n-type source/drain regions are formed in a self-aligned manner with the polyside gate electrode 24. Channel regions 25 are shown in FIG. 1D, and the n-type source/drain regions are under the paper and over the paper where the channel regions 25 are drawn. For this reason, the n-type source/drain regions are not seen.

The n-type source/drain regions are formed after completion of the bipolar transistor. For this reason, the impurity profile of the n-type source/drain regions is never affected by the high-temperature long-time heat treatment for the diffusion of arsenic from the doped polysilicon into the lightly-doped p-type intrinsic base region 8. The manufacturer optimizes the high-temperature long-time heat treatment for the heavily-doped n-type emitter region 12. Thus, the prior art process shown in FIGS. 1A to 1D is desirable for a large current amplification factor of the bipolar transistor, and the punch-through phenomenon is less liable to take place in the field effect transistors.

However, the manufacturer suffers from a low production yield of the prior art semiconductor static random access memory device fabricated through the prior art process due to parasitic transistors under the field oxide layer 4. In detail, the polyside gate electrode 24 extends over the field oxide layer 4, and forms a MOS structure together with the field oxide layer 4 and the p-type well 7 under the field oxide layer 4. The field oxide layer 4 is theoretically so thick that the parasitic MOS transistor does not turn on. However, while the thick silicon oxide layer 10 is being etched from the active areas assigned to the field effect transistors, the field oxide layer 4 is partially etched, and the thickness B is decreased. The silicon oxide layer 10 is thick, and the thickness is not constant. For this reason, the over-etching is unavoidable. When the field oxide layer 4 becomes thin, the threshold of the parasitic MOS transistor is lowered, and the parasitic MOS transistor is liable to turn on. If the parasitic MOS transistor turns on under the normal conditions, malfunction takes place in the static random access memory device, and the product is rejected as a defective product.

If the manufacturer finishes the chemical vapor deposition earlier, the silicon oxide layer 10 becomes thin, and the over-etching is not serious. The field oxide layer keeps the thickness, and the parasitic MOS transistor hardly turns on. However, the thin silicon oxide layer 10 is undesirable for the high-frequency characteristics of the bipolar transistor.

The cut-off frequency of a bipolar transistor relates to the signal delay between the emitter and the collector, and one of the factors for the signal delay is an emitter capacitance. If the silicon oxide layer 10 is thin, the thin silicon oxide layer 10 increases the capacitance between the emitter electrode and the emitter region 12 and, accordingly, the emitter capacitance. The large emitter capacitance requires long charging time, and increases the signal delay. The current amplification factor reaches "1" at a low frequency, and the cut-off frequency is lowered.

The bipolar transistor is expected to improve the access speed through the high-speed switching action. However, if the emitter capacitance is increased, the cut-off frequency is lowered, and the signal delay between the emitter and the collector becomes serious. This results in that the bi-CMOS circuit can not satisfy the design specification, and the product is rejected as defective.

SUMMARY OF THE INVENTION

It is therefore an important object of the present invention to provide a semiconductor integrated circuit device, which has a combination of bipolar transistors with a high cut-off frequency and field effect transistors on a single semiconductor chip without disturbance of parasitic MOS transistors.

It is also an important object of the present invention to provide a process for fabricating the semiconductor integrated circuit device.

The present inventor investigated an appropriate structure for the field oxide layer incorporated in a combined circuit between bipolar transistors and field effect circuits, and found Japanese Patent Publication of Unexamined Application Nos. 9-232456, 5-235285 and 9-92720.

Japanese Patent Publication of Unexamined 9-232456 disclosed a process for fabricating a bi-CMOS circuit. The Japanese Patent Publication of Unexamined Application proposed to eliminate a step between the bipolar transistor and the MOS transistor by using a dummy pattern. However, the Japanese Patent Publication of Unexamined Application was silent to how to prevent the field oxide layer from an over-etching.

Japanese Patent Publication of Unexamined Application No. 5-235285 disclosed a process for fabricating a bi-CMOS circuit. According to the Japanese Patent Publication of Unexamined Application, a silicon nitride layer used in growth of a field oxide layer was left in active areas assigned for the bipolar transistors. The silicon nitride layer kept the thickness constant between the growth of field oxide layer and formation of an emitter contact hole. Dopant impurity was diffused from an emitter electrode held in contact with the base region through the emitter contact hole formed in the silicon nitride layer. As a result, the emitter capacitance was constant between the bipolar transistors. Although the bipolar transistors were improved in the high-frequency characteristics, the Japanese Patent Publication of Unexamined Application was silent to parasitic MOS transistors under the field oxide layer.

Japanese Patent Publication of Unexamined Application No. 9-92720 disclosed a process for fabricating a bi-CMOS circuit. The Japanese Patent Publication of Unexamined Application taught how to form a rink base around an emitter region. However, the Japanese Patent Publication of Unexamined Application is silent to an over-etching on the field oxide layer.

Thus, the present inventor confirmed that any appropriate structure for the combined circuit had not been known. To accomplish the object, the present invention proposes to make a field portion in an area assigned to field effect transistors thicker than another field portion in an area assigned to a bipolar transistor.

In accordance with one aspect of the present invention, there is provided a semiconductor integrated circuit device having an integrated circuit fabricated on a semiconductor substrate comprising a field insulating layer selectively grown on a major surface of the semiconductor substrate for defining first active regions and second active regions, and having a first field portion grown between the first active regions and a second field portion grown between the second active regions and thicker than the first field portion, a bipolar transistor assigned to the first active regions, and forming a part of the integrated circuit, and other circuit components of the integrated circuit assigned to the second active regions, and having a conductive layer partially on the second field portion so that a parasitic transistor takes place under the second field portion.

In accordance with another aspect of the present invention, there is provided a process for fabricating a semiconductor integrated circuit device, comprising steps of: preparing a semiconductor substrate having a major surface; selectively growing a field insulating layer on the major surface for defining first active regions assigned to a bipolar transistor and second active regions assigned to other circuit components; forming a collector and a base nested in the collector in the first active regions; covering the second active regions and a part of the field insulating layer between the second active regions with an etching stopper layer; forming a first insulating layer over the first active regions and the etching stopper layer; forming an emitter region nested in the base through a diffusion from an emitter electrode passing through an emitter contact hole formed in the first insulating layer; selectively etching the first insulating layer so as to remove a part of the first insulating layer from at least a place over the second active regions, removing the etching stopper layer; and completing the other circuit components in the second active regions.

BRIEF DESCRIPTION OF THE DRAWINGS

The features and advantages of the semiconductor integrated circuit device and the process will be more clearly understood from the following description taken in conjunction with the accompanying drawings in which.

DESCRIPTION OF THE PREFERRED EMBODIMENTS

First Embodiment

Figure 1A:
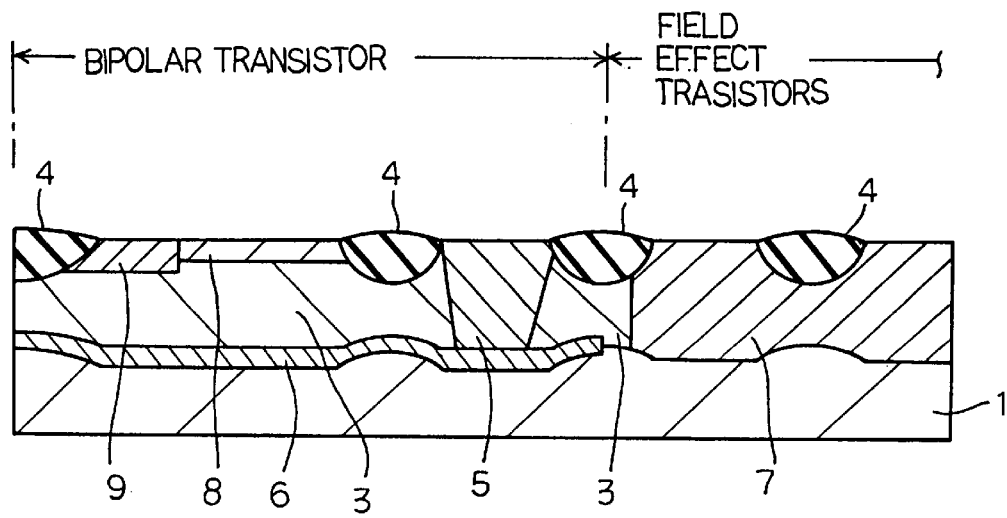
FIGS. 1A to 1D are cross sectional views showing the prior art process for fabricating a bi-CMOS circuit.
Figure 1B:
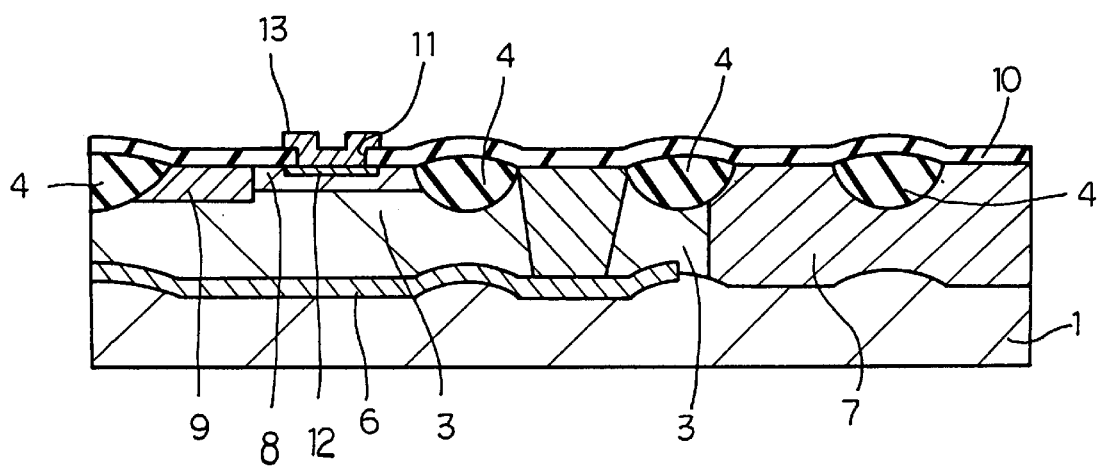
Figure 1C:
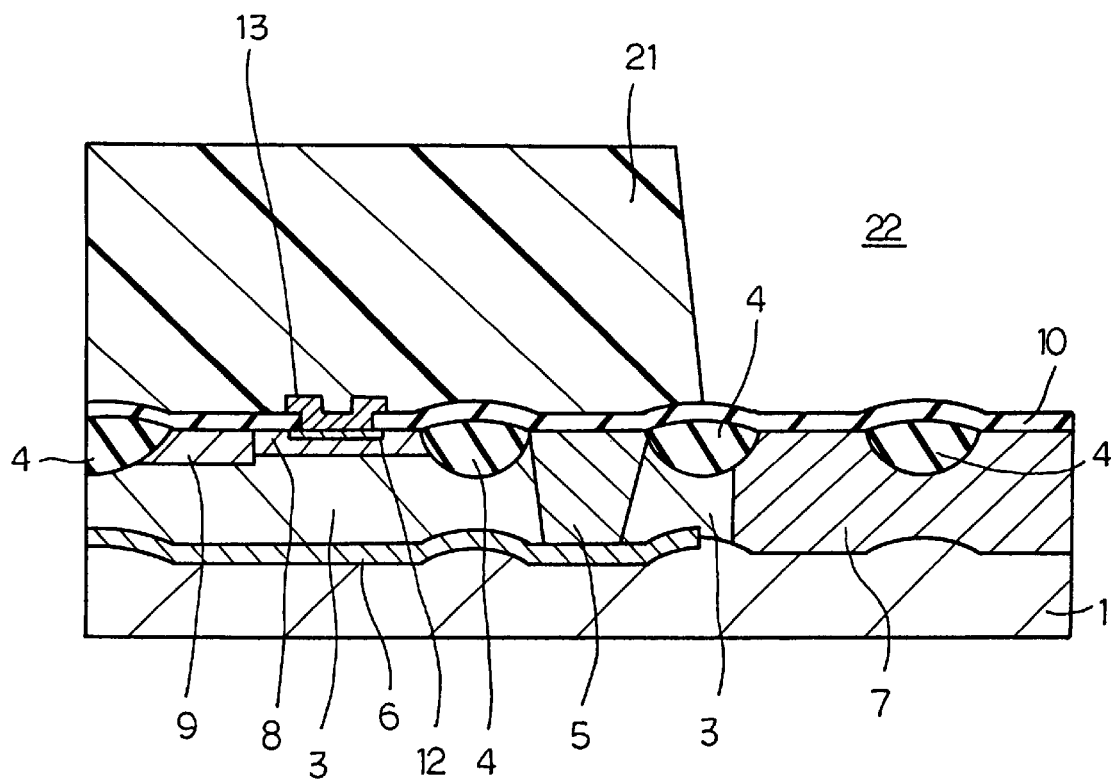
Figure 1D:
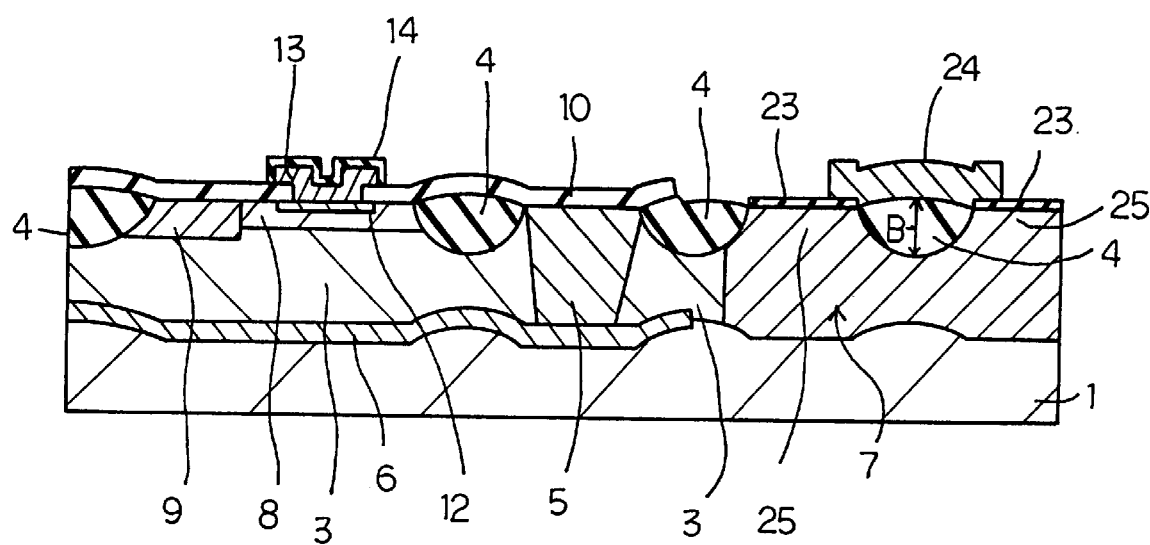
Figure 2:
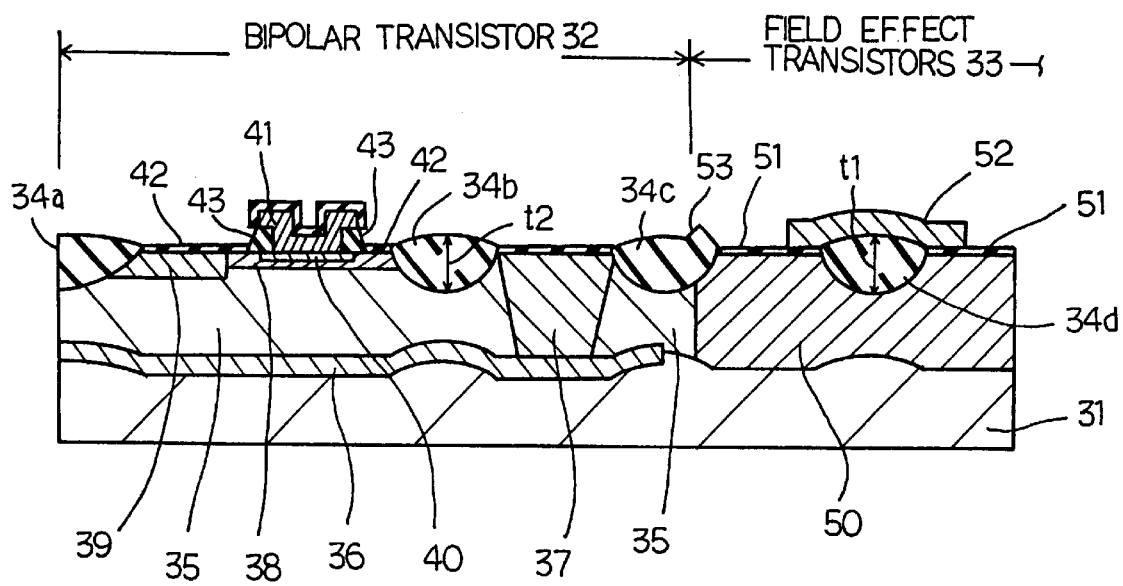
FIG. 2 is a cross-sectional view showing the structure of a semiconductor integrated circuit device according to the present invention.

Referring to FIG. 2 of the drawings, a semiconductor integrated circuit device embodying the present invention is fabricated on a silicon substrate 31. The semiconductor integrated circuit device has an integrated circuit such as, for example, a static random access memory, and a bipolar transistor 32 and field effect transistors 33 are incorporated in the integrated circuit. A field oxide layer 34*a*/34*b*/34*c*/34*d* is selectively grown on the major surface of the silicon substrate 31, and defines an active area assigned to the bipolar transistor 32 and other active areas assigned to the field effect transistors 33.

The bipolar transistor 32 includes a lightly-doped n-type collector region 35, an n-type buried layer 36 under the lightly-doped n-type collector region 35 and a heavily-doped n-type collector contact region 37 penetrating the lightly-doped n-type collector region 35 and held in contact with the n-type buried layer 36. Though not shown in FIG. 2, a collector electrode is held in contact with the surface of the heavily-doped n-type collector contact region 37.

The bipolar transistor 32 further includes a lightly-doped p-type intrinsic base region 38 and a heavily-doped p-type graft base region 39 continued from the lightly-doped p-type intrinsic base region 38. Though not shown in FIG. 2, a base electrode is held in contact with the heavily-doped p-type graft base region 39.

The bipolar transistor 32 further includes a heavily-doped n-type emitter region 40 nested in the lightly-doped p-type intrinsic base region 38 and an emitter electrode 41 held in contact with the heavily-doped n-type emitter region 40. The heavily-doped p-type graft base region 39 and the lightly-doped p-type intrinsic base region 38 are covered with a thin silicon oxide layer 42, and a thick silicon oxide spacer 43 is provided between the heavily-doped n-type emitter region 40 and the emitter electrode 41. The silicon oxide spacer 43 is much thicker than the silicon oxide layer 42. The silicon oxide spacer 43 is so thick that the emitter capacitance is effectively reduced. As a result, the bipolar transistor 32 has a high cut-off frequency, and is improved in the high-frequency characteristics.

The field effect transistors 33 are fabricated on a p-type well 50. Each of the field effect transistors includes a thin gate oxide layer 51 grown on the surface of the p-type well 50, a polyside gate electrode 52 partially on the gate oxide layer 51 and partially on the field oxide layer 34*d* and n-type source/drain regions (not shown). The polyside gate electrode 52 is of the order of 0.3 micron in width. However, the punch-through phenomenon does not take place between the source and drain regions, because the source/drain regions maintain the impurity profiles close to the designed profiles. The n-type source/drain regions are not shown in FIG. 2, because they are located on both sides of the cross section.

The field oxide layer 34*d* in the area assigned to the field effect transistors 33 is thicker than the field oxide layer 34*a*/34*b* in the area assigned to the bi-polar transistor 32, i.e., t1>t2. There is a step 53 on the surface of the field oxide layer 34*c*, and the step 53 is formed during an etching step in a fabrication process as will be described hereinbelow.

Even though the silicon oxide spacer 43 is thick enough to reduce the emitter capacitance, the field oxide layer 34*d* keeps the thickness t1 large, and the thick field oxide layer 34*d* does not allow a parasitic MOS transistor undesirably to turn on. Thus, the bipolar transistor 32 exhibits good high-frequency characteristics, and the field effect transistors 33 are not disturbed by the parasitic MOS transistor. Both bipolar and field effect transistors 32/33 are less liable to be diagnosed as defective, and the production yield is improved.

The semiconductor integrated circuit device is fabricated through a process sequence shown in FIGS. 3A to 3F. The process starts with preparation of the silicon substrate 31. First, phosphorous is ion implanted into a surface portion of the silicon substrate 31 at dosage of 5E11 to 1E1012 atom/square-cm under acceleration energy of 70–100 KeV, and forms the lightly-doped n-type collector region 35.

Figure 3A:
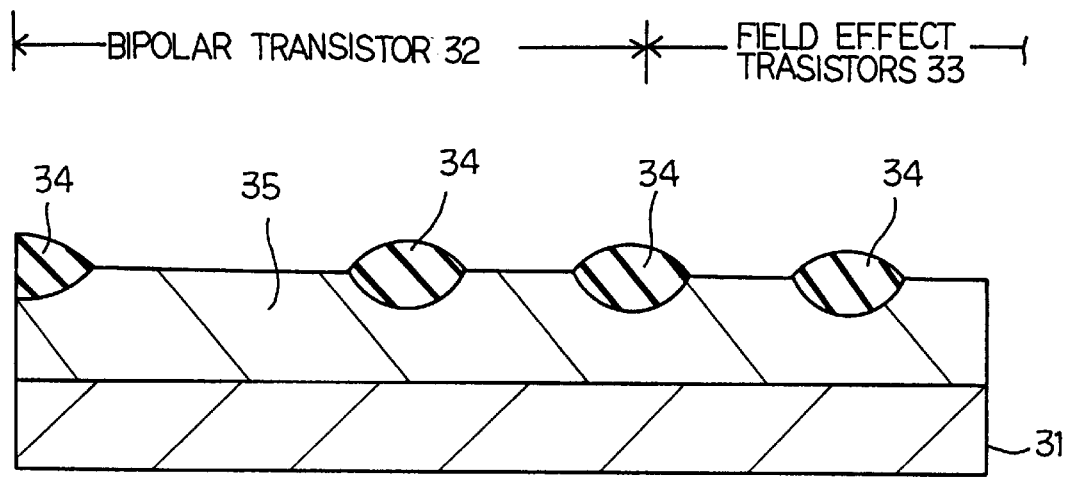
FIGS. 3A to 3F are cross sectional views showing a process for fabricating the semiconductor integrated circuit device according to the present invention.

Subsequently, silicon oxide is selectively grown to 400 nanometers thick on the major surface by using the LOCOS technique, and forms the thick field oxide layer 34 as shown in FIG. 3A. The field oxide layer 34 is as thick as the field oxide layer 34*d*, and the step 53 is not formed. The field oxide layer 34 defines the active area assigned to the bipolar transistor 32 and another active area assigned to the field effect transistors 33.

A photo-resist ion-implantation mask (not shown) is formed on the major surface by using the photo-lithographic techniques, and has an opening over a region assigned to the heavily-doped n-type collector contact region 37, and phosphorous is ion implanted into the region at dosage of 5E15 to 1E16 atom/square-cm under acceleration energy of 70–100 KeV. The photo-resist ion-implanted mask is stripped off. The ion-implanted phosphorous is activated at 950–1000 degrees in centigrade for 30–45 minutes. As a result, the heavily-doped n-type collector contact region 37 is formed in the lightly-doped n-type collector region 35.

A photo-resist ion-implantation mask (not shown) is formed on the major surface by using the photo-lithographic techniques, and has an opening over the active area assigned to the bipolar transistor 32. Phosphorous is ion implanted into the active area at dosage of 3E13 to 5E13 atom/square-cm under acceleration energy of 1000–1200 KeV, and the photo-resist ion-implantation mask is stripped off after the ion-implantation. The phosphorous are activated at 950–1000 degrees in centigrade for 10–20 minutes, and forms the n-type buried layer 36. The n-type buried layer 36 is connected to the heavily-doped n-type collector contact region 37.

Subsequently, an ion-implantation mask (not shown) is formed on the major surface by using the photo-lithographic techniques, and has an opening over the active areas assigned to the field effect transistors 33. Boron is ion implanted into the active areas at dosage of 1E13 to 2E13 atom/square-cm under acceleration energy 250–300 KeV, and a channel doping is carried out for the field effect transistors 33. The photo-resist ion-implantation mask is stripped off. The boron forms the p-type well 50.

Subsequently, an ion-implantation mask (not shown) is formed on the major surface by using the photo-lithographic techniques, and has an opening over the surface of the lightly-doped n-type collector region 35. Boron is ion implanted into the lightly-doped n-type collector region 35 at dosage of 2E13 to 3E13 atom/square-cm under acceleration energy of 15–20 KeV. The ion-implantation mask is stripped off. The boron forms the lightly-doped p-type intrinsic base region 38.

A photo-resist ion-implantation mask (not shown) is formed on the major surface by using the photo-lithographic techniques, and has an opening over a part of the lightly-doped p-type intrinsic base region 38. Boron fluoride is ion implanted into the part of the lightly-doped p-type intrinsic base region 38 at dosage of 1E15 to 2E15 atom/square-cm under acceleration energy of 30–50 KeV. The photo-resist ion-implantation mask is stripped off, and the boron fluoride forms the heavily-doped p-type graft base region 39.

Figure 3B:
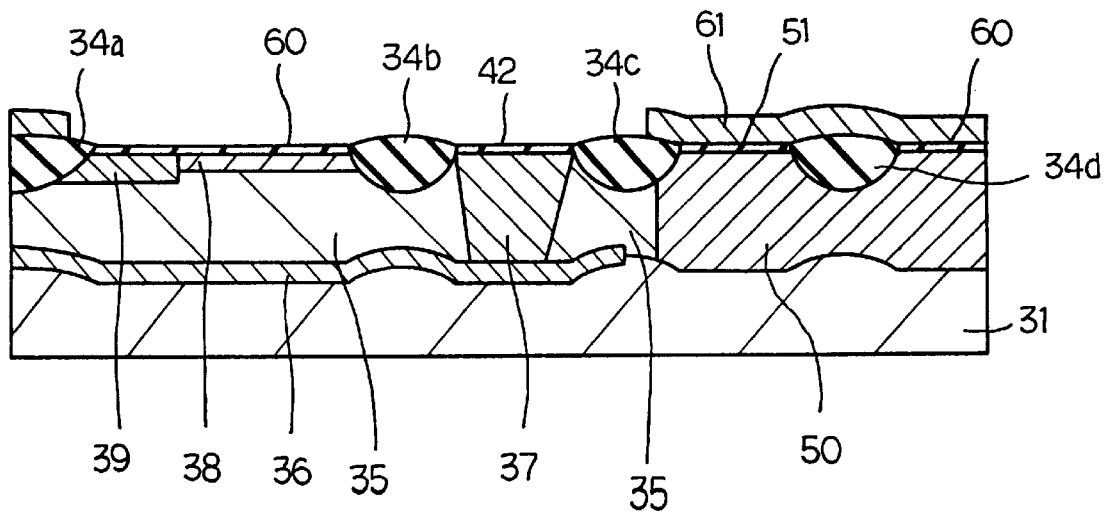

Silicon oxide is thermally grown to 10 nanometers thick on the exposed surface of the silicon substrate 31, and forms a thin silicon oxide layer 60. Polysilicon is deposited to 100 nanometers thick over the entire surface of the resultant semiconductor structure by using a chemical vapor deposition, and forms a polysilicon layer 61. A photo-resist etching mask (not shown) is formed on the polysilicon layer 61, and has an opening over the active area assigned to the bipolar transistor 32. Using the photo-resist etching mask, the polysilicon layer 61 is selectively etched away, and the polysilicon layer 61 is left on the active areas assigned to the field effect transistors 33 as shown in FIG. 3B. The thin silicon oxide layer 60 and the field oxide layer 34*d* are covered with the polysilicon layer 61. In this instance, the polysilicon layer 61 serves as an etching stopper.

Figure 3C:
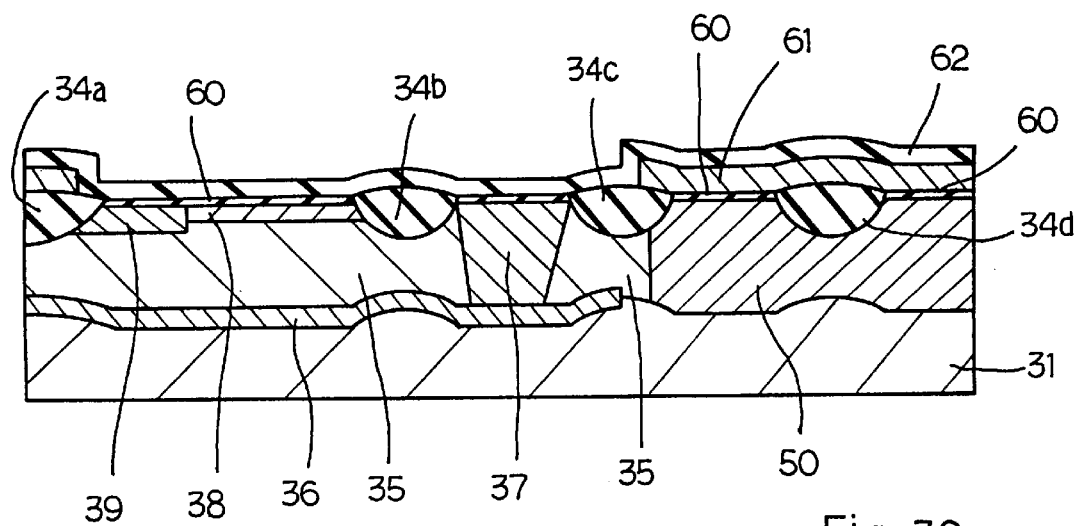

Silicon oxide is deposited to 100 nanometers thick over the entire surface of the resultant semiconductor structure by using a chemical vapor deposition, and forms a thick silicon oxide layer 62. Not only the active areas assigned to the bipolar transistor but also the polysilicon layer 61 over the active areas assigned to the field effect transistors are covered with the thick silicon oxide layer 62 as shown in FIG. 3C.

A photo-resist etching mask (not shown) is formed on the thick silicon oxide layer 62, and has an opening over a part of the lightly-doped p-type intrinsic base region 38. The thick silicon oxide layer 62 is selectively etched away, and an emitter contact hole 63 is formed in the thick silicon oxide layer 62.

Subsequently, polysilicon is deposited to 150 nanometers thick over the entire surface of the resultant semiconductor structure by using the chemical vapor deposition. The polysilicon fills the emitter contact hole 63, and is spread over the thick silicon oxide layer 62. Arsenic is ion implanted into the polysilicon layer at dosage of 1E16 to 1.5E16 atom/square-cm under acceleration energy of 60–70 KeV. Then, the polysilicon layer is heavily doped with the arsenic.

The arsenic-doped polysilicon layer is heated to 850–900 degrees in centigrade for 15 minutes to 25 minutes. The arsenic is diffused from the polysilicon layer into the lightly-doped p-type intrinsic base region 38, and forms the heavily-doped n-type emitter region 40. The heavily-doped n-type emitter region 40 is nested in the lightly-doped p-type intrinsic base region 38.

Figure 3D:
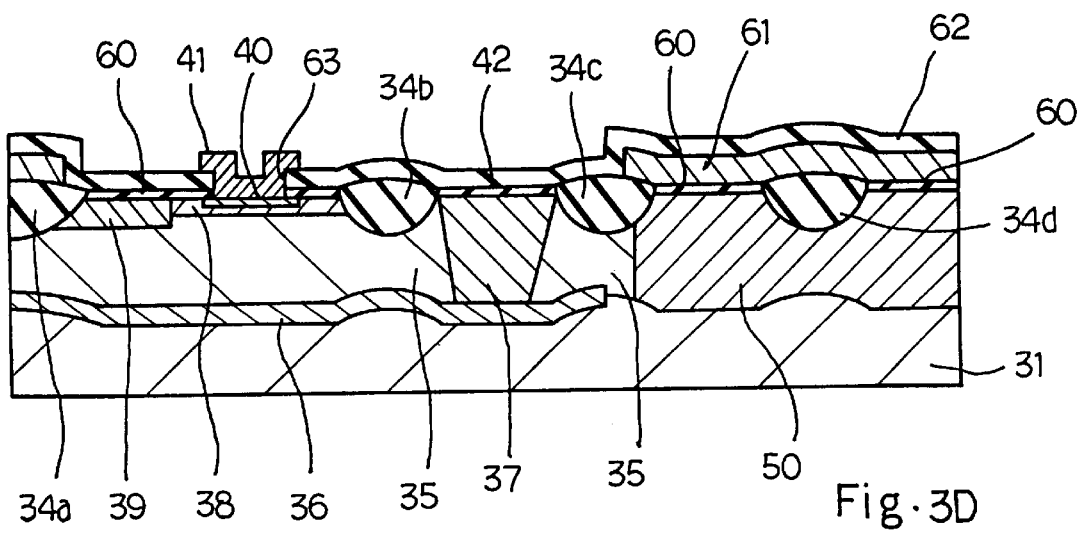

A photo-resist etching mask (not shown) is patterned on the polysilicon layer by using the photo-lithographic techniques, and the polysilicon is selectively etched away. As a result, the emitter electrode 41 is formed as shown in FIG. 3D. The emitter electrode 41 passes through the emitter contact hole 63, and is held in contact with the heavily-doped n-type emitter region 40. However, the thick silicon oxide layer 62 is provided under the emitter electrode 41, and reduces the emitter capacitance.

Figure 3E:
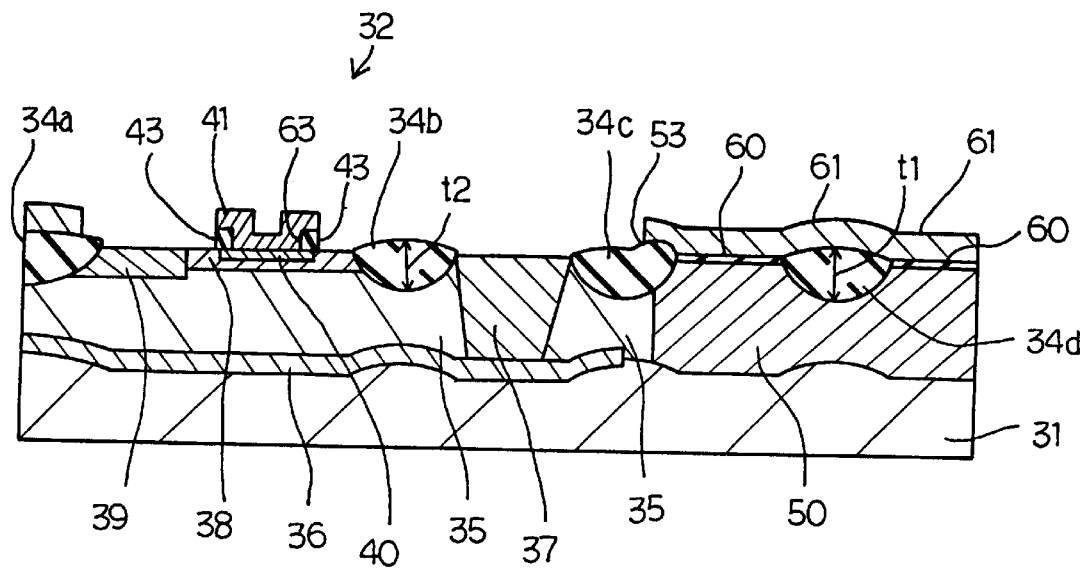

Subsequently, the silicon oxide layer 62 is etched away by using a wet etching technique. The wet etching is continued for a time period long enough to perfectly remove the silicon oxide layer 62, and the field oxide layer 34b/34c is partially etched. The thin silicon oxide layer 60 on the base/collector contact regions 38/39/37 is etched away during the wet etching. However, the polysilicon layer 61 prevents the field oxide layer 34d from the etchant, and the field oxide layer 34d is never etched. For this reason, the field oxide layer 34b becomes thinner than the field oxide layer 34a, and the field oxide layer 34a maintains the original thickness. A part of the field oxide layer 34c is partially covered with the polysilicon layer 61, and the step 53 is formed during the wet etching. Thus, the field oxide layer 34c is partially etched away, and decreases the thickness. However, the decreased portion is closer to the bipolar transistor 32 than the field effect transistor, and the remaining portion keeps the original thickness. The bipolar transistor 32 is sufficiently spaced from the field oxide layer 34c. For this reason, the parasitic MOS transistor does not disturb the bipolar transistor 32 and the field effect transistors 33. The silicon oxide spacer layer 43 is left under the emitter electrode 41. The resultant semiconductor structure is shown in FIG. 3E.

Subsequently, a photo-resist etching mask (not shown) is formed on the resultant semiconductor structure, and has an opening over the active areas assigned to the field effect transistors 33. The polysilicon etching stopper 61 is etched away by using a dry etching) and the thin silicon oxide layer 60 is further etched away from the active areas assigned to the field effect transistors 33. The photo-resist etching mask is stripped off.

Subsequently, the n-channel enhancement type field effect transistors 33 are formed as follows. The active areas are thermally oxidized, and silicon oxide is grown to 7 nanometers thick. The silicon oxide forms the gate oxide layers 51 on the active areas assigned to the field effect transistors 33 and the thin silicon oxide layer 42 on the active area assigned to the bipolar transistor 32, and the emitter electrode 41 is covered with a silicon oxide layer 63a. The silicon oxide spacer layers 43 increases the width, and the field oxide layer 34a/34b/34c/34d increases the thickness.

Figure 3F:
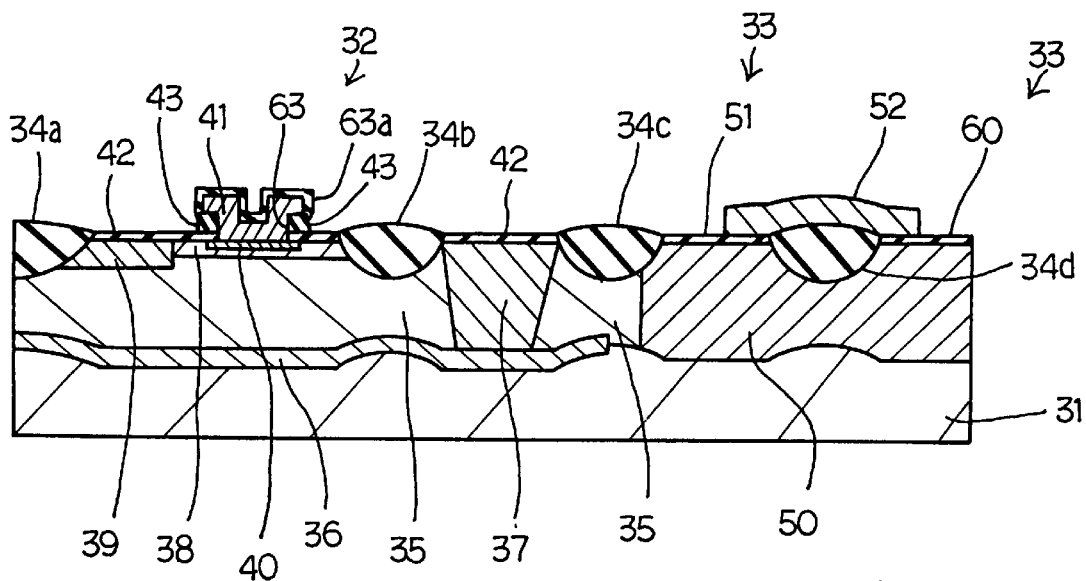

Polysilicon is deposited to 100 nanometers thick over the entire surface of the resultant semiconductor structure by using the chemical vapor deposition, and forms a polysilicon layer. Phosphorous is thermally diffused into the polysilicon layer, and is converted to a doped polysilicon. Titanium silicide or tungsten silicide is deposited to 100 nanometers thick over the doped polysilicon layer by using a sputtering technique, and a photo-resist etching mask (not shown) is formed on the refractory metal silicide layer. The refractory metal silicide layer and the doped polysilicon layer are selectively etched away, and a polyside gate electrode 52 is formed. The polyside gate electrode 52 extends over the field oxide layer 34d, and reaches the gate oxide layers 60 as shown in FIG. 3F. Finally, the n-type source/drain regions are formed in a self-aligned manner with the polyside gate electrode 52, and the field effect transistors 33 are completed as shown in FIG. 3F. The source/drain regions maintain the impurity profile, because the high-temperature heat treatment for the emitter region has been already carried out. Although the polyside gate electrode 52 is as narrow as 0.3 micron wide, the undesirable punch-through phenomenon does not take place under the usual operation conditions.

As will be appreciated from the foregoing description, the polysilicon etching stopper 61 does not allow the wet etchant to decrease the thickness of the field oxide layer 34d in the area assigned to the field effect transistors 33. For this reason, the manufacturer can design the thickness of the silicon oxide layer 62 to an appropriate value, and the silicon oxide spacer layers 43 widely space the emitter electrode 41 from the emitter region 40. This results in a small emitter capacitance, and the bipolar transistor 32 exhibits good high-frequency characteristics. The field oxide layer 34d maintains the original thickness after the completion of the bipolar transistor 32, and the parasitic MOS transistor, i.e., the p-type well, the field oxide layer 34d and the polyside gate electrode 52 hardly turns on in the usual operation.

Second Embodiment

Figure 4:
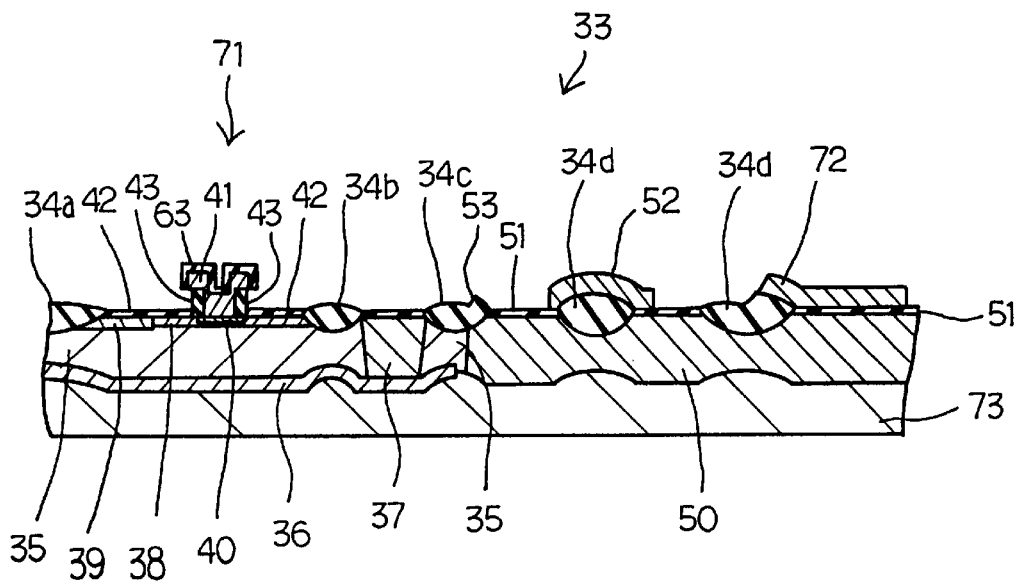
FIG. 4 is a cross-sectional view showing the structure of another semiconductor integrated circuit device according to the present invention.

FIG. 4 illustrates another semiconductor integrated circuit device embodying the present invention. A bipolar transistor 71 and a resistor element 72 are fabricated on a silicon substrate 73 together with field effect transistors, and form an emitter-coupled logic circuit. The emitter-coupled logic circuit forms a part of an integrated circuit on the silicon substrate 73.

The field oxide layer and the bipolar transistor 71 are similar to those of the first embodiment, and portions of the field oxide layer and component layers and regions of the bipolar transistor 71 are labeled with the same references designating corresponding portions, regions and layers of the first embodiment without detailed description for the sake of simplicity.

The resistor element 72 is partially on the silicon oxide layer 51 and partially on the field oxide layer 34d.

The semiconductor integrated circuit device shown in FIG. 4 is fabricated through a process sequence as follows. The process is similar to the process sequence implementing the first embodiment until the wet etching using the polysilicon layer 61 as the etching stopper.

A photo-resist etching mask (not shown) is formed on the resultant semiconductor structure, and the polysilicon layer 61 is partially etched away by using a dry etching technique. The resistor element 72 is left on the active area and the field oxide layer 34d. After the patterning step for the resistor element 72, the process returns to the process sequence implementing the first embodiment, and the silicon oxide layer 42 and the gate oxide layer 51 are grown on the active area assigned to the field effect transistor 33.

The semiconductor integrated circuit device shown in FIG. 4 achieves all the advantages of the first embodiment. Although the emitter-coupled logic is incorporated in the integrated circuit, the resistor element 72 is formed from the polysilicon layer 61 serving as the etching stopper, and a deposition step is not required for the resistor element 72.

Although particular embodiments of the present invention have been shown and described, it will be apparent to those skilled in the art that various changes and modifications may be made without departing from the spirit and scope of the present invention.

The semiconductor integrated circuit device is never limited to the static random access memory. The bipolar transistor may be a p-n-p type, and the field effect transistor may be a p-channel type formed in an n-type well.

Although the polysilicon layer 61 is used as the etching stopper, the etching stopper is never limited to the polysilicon layer. Any material selective to the silicon oxide is available for the etching stopper. The etching stopper may be formed of silicon nitride.

What is claimed is:

1. A process for fabricating a semiconductor integrated circuit device, comprising steps of:
   a) preparing a semiconductor substrate having a major surface;
   b) selectively growing a field insulating layer on said major surface for defining first active regions assigned to a bipolar transistor and second active regions assigned to other circuit components;
   c) forming a collector and a base nested in said collector in said first active regions;
   d) covering said second active regions and a part of said field insulating layer between said second active regions with an etching stopper layer;
   e) forming a first insulating layer over said first active regions and said etching stopper layer;
   f) forming an emitter region nested in said base through a diffusion from an emitter electrode passing through an emitter contact hole formed in said first insulating layer;
   g) selectively etching said first insulating layer so as to remove a part of said first insulating layer from at least a place over said second active regions;
   h) removing said etching stopper layer; and
   i) completing said other circuit components in said second active regions.

2. The process as set forth in claim 1, in which said field insulating layer is thermally grown on said major surface of said semiconductor substrate of silicon through a selective oxidation so that said field insulating layer has a first thickness in said step b), and
   said part of said field insulting layer after the completion of said other circuit components has a second thickness approximately equal to said first thickness.

3. The process as set forth in claim 1, in which a field effect transistor is one of said other circuit components, and includes
   a gate insulating layer formed on one of said second active regions and
   a gate electrode partially on said gate insulating layer and partially on said part of said field insulating layer.

4. The process as set forth in claim 3, in which said gate insulating layer is thinner than said first insulating layer.

5. The process as set forth in claim 3, in which said step i) includes the sub-steps of
   i-1) growing said gate insulating layer on said one of said second active region,
   i-2) depositing a conductive material on the entire surface of the resultant structure at said step i-1) for forming a preliminary gate layer,
   i-3) patterning said preliminary gate layer into said gate electrode, and
   i-4) introducing a dopant impurity into said one of said second active regions in a self-aligned manner with said gate electrode.

6. The process as set forth in claim 1, in which a field effect transistor and a resistor element are two of said other circuit components, and said field effect transistor includes a gate insulating layer formed on one of said second active regions and
   a gate electrode partially on said gate insulating layer and partially on said part of said field insulating layer.

7. The process as set forth in claim 6, in which said gate insulating layer is thinner than said first insulating layer.

8. The process as set forth in claim 6, in which said etching stopper layer is formed of a conductive material, and said etching stopper layer is selectively etched in said step h) for forming said resistor element from said etching stopper layer.

9. The process as set forth in claim 6, in which said resistor element is formed from said etching stopper layer at said step h), and said step i) includes the steps of
   i-1) growing said gate insulating layer on said one of said second active region,
   i-2) depositing a conductive material on the entire surface of the resultant structure at said step i-1) for forming a preliminary gate layer,
   i-3) patterning said preliminary gate layer into said gate electrode, and
   i-4) introducing a dopant impurity into said one of said second active regions in a self-aligned manner with said gate electrode.

10. The process as set forth in claim 1, In which said etching stopper layer is removed by using an etchant having a selectivity between a first material for said first insulating layer and a second material for said etching stopper layer.

11. The process as set forth in claim 10, in which said first material is silicon oxide, and said second material is selected from the group consisting of polysilicon and silicon nitride.

12. The process as set forth in claim 1, in which said step d) includes the sub-steps of
   d-1) forming a second insulating layer thinner than said first insulating layer on said first active regions and said second active regions,
   d-2) depositing a first material on the entire surface of the resultant structure at said step d-1) for forming a preliminary etching stopper layer, and
   d-3) selectively etching said preliminary layer for patterning said preliminary etching stopper layer into said etching stopper layer.

13. The process as set forth in claim 12, in which said first insulating layer and said second insulating layer are formed of a second material, and an etchant used in said step h) has a selectivity between said first material and said second material.

14. The process as set forth in claim 13, in which said first material is elected from the group consisting of polysilicon and silicon nitride, and said second material is silicon oxide.

* * * * *